(12) United States Patent
Karasawa

(10) Patent No.: US 11,177,236 B2
(45) Date of Patent: Nov. 16, 2021

(54) SEMICONDUCTOR DEVICE HAVING CASE TO WHICH CIRCUIT BOARD IS BONDED BY BONDING MATERIAL AND METHOD OF MANAFACTURING THEREOF

(71) Applicant: FUJI ELECTRIC CO., LTD., Kawasaki (JP)

(72) Inventor: Tatsuya Karasawa, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/553,949

(22) Filed: Aug. 28, 2019

(65) Prior Publication Data
US 2020/0126947 A1 Apr. 23, 2020

(30) Foreign Application Priority Data
Oct. 18, 2018 (JP) .............................. JP2018-196279

(51) Int. Cl.
*H01L 23/00* (2006.01)
*H01L 23/373* (2006.01)
(Continued)

(52) U.S. Cl.
CPC .......... *H01L 24/48* (2013.01); *H01L 21/4853* (2013.01); *H01L 21/52* (2013.01);
(Continued)

(58) Field of Classification Search
CPC ...... H05K 2201/10–2201/10992; H01L 24/48; H01L 23/3735; H01L 25/18; H01L 25/072; H01L 24/85; H01L 25/50; H01L 21/4853; H01L 21/52; H01L 23/057; H01L 2224/85205; H01L 2924/10253; H01L 2924/10272; H01L 2924/13055; H01L 2924/13091; H01L 2924/12032; H01L 2924/1203; H01L 2224/48157; H01L 2224/48227; H01L 23/04; H01L 2223/54426; H01L 2223/54486;
(Continued)

(56) References Cited

U.S. PATENT DOCUMENTS 5,461,256 A * 10/1995 Yamada ........... G06K 19/07745
257/679
5,646,827 A * 7/1997 Hirao ................ H01L 23/49811
257/E23.066

(Continued)

FOREIGN PATENT DOCUMENTS

JP 2000-077602 A 3/2000
JP 2004-022922 A 1/2004
(Continued)

*Primary Examiner* — Mohammad M Hoque
(74) *Attorney, Agent, or Firm* — Rabin & Berdo, P.C.

(57) ABSTRACT

A semiconductor device includes a circuit board including an insulating layer having opposite front and rear surfaces, an electrode pad disposed on the front surface, a housing having an installation area for the circuit board, and a bonding material embedded in a recess within either a first area located at the rear surface of the insulating layer directly below an area of the circuit board in which the electrode pad is disposed, or at a second area located within the installation area of the housing and corresponding to the first area in a plan view.

16 Claims, 11 Drawing Sheets

(51) Int. Cl.
*H01L 25/18* (2006.01)
*H01L 25/07* (2006.01)
*H01L 25/00* (2006.01)
*H01L 21/48* (2006.01)
*H01L 21/52* (2006.01)
*H01L 23/057* (2006.01)

(52) U.S. Cl.
CPC ........ *H01L 23/057* (2013.01); *H01L 23/3735* (2013.01); *H01L 24/85* (2013.01); *H01L 25/072* (2013.01); *H01L 25/18* (2013.01); *H01L 25/50* (2013.01); *H01L 2224/48157* (2013.01); *H01L 2224/85205* (2013.01); *H01L 2924/10253* (2013.01); *H01L 2924/10272* (2013.01); *H01L 2924/1203* (2013.01); *H01L 2924/12032* (2013.01); *H01L 2924/13055* (2013.01); *H01L 2924/13091* (2013.01)

(58) Field of Classification Search
CPC . H01L 23/544; H01L 23/053; H01L 23/5385; H01L 23/13; H01L 23/49; H01L 23/492; H01L 21/56

USPC ........................................................ 257/703
See application file for complete search history.

(56) References Cited

U.S. PATENT DOCUMENTS

| | | | |
|---|---|---|---|
| 6,209,398 B1* | 4/2001 | Fowler, Jr. | G01L 19/141 |
| | | | 73/718 |
| 2013/0021754 A1* | 1/2013 | Lu | H05K 1/0203 |
| | | | 361/714 |
| 2014/0233247 A1* | 8/2014 | Olsson | F21V 31/03 |
| | | | 362/373 |
| 2016/0381798 A1* | 12/2016 | Wu | G01D 11/30 |
| | | | 361/748 |
| 2017/0012142 A1* | 1/2017 | Lin | H01L 27/14618 |
| 2020/0085310 A1* | 3/2020 | Zahner | G01K 13/20 |

FOREIGN PATENT DOCUMENTS

| JP | 2004-031495 A | | 1/2004 |
|---|---|---|---|
| JP | 2009-289831 A | | 12/2009 |
| JP | 2009289831 A1 | * | 12/2009 |

* cited by examiner

SEMICONDUCTOR DEVICE HAVING CASE TO WHICH CIRCUIT BOARD IS BONDED BY BONDING MATERIAL AND METHOD OF MANAFACTURING THEREOF

CROSS-REFERENCE TO RELATED APPLICATION

This application is based upon and claims the benefit of priority of the prior Japanese Patent Application No. 2018-196279, filed on Oct. 18, 2018, the entire contents of which are incorporated herein by reference.

BACKGROUND OF THE INVENTION

1. Field of the Invention

The embodiments discussed herein are related to a semiconductor device and a semiconductor device manufacturing method.

2. Background of the Related Art

With a semiconductor device a semiconductor element, such as an insulated gate bipolar transistor (IGBT), a power metal oxide semiconductor field effect transistor (MOS-FET), a Schottky barrier diode (SBD), or a freewheeling diode (FWD), and a ceramic circuit board on which the semiconductor element is disposed are housed in a case. Furthermore, a printed-circuit board electrically connected to the semiconductor element is housed in the case. In this case, the printed-circuit board is fixed onto a determined installation area of the bottom of the case with an adhesive (see, for example, Japanese Laid-open Patent Publication No. 2009-289831).

In addition, with the above semiconductor device electrode pads of the printed-circuit board are electrically connected to the semiconductor element, external connection terminals integrally molded with the case, and the like with bonding wires.

With the above semiconductor device the spread of the adhesive applied between the printed-circuit board and the determined installation area of the bottom of the case may be uneven, depending on an application amount, an application position, or the like. As a result, if the adhesive is not sufficiently applied just under the electrode pad of the printed-circuit board, then a layer of air may be interposed there. In this case, the electrode pad also vibrates when a bonding wire is bonded to the electrode pad by ultrasonic vibration. Accordingly, it may be that the bonding wire will not be bonded reliably to the electrode pad. As a result, the reliability of the semiconductor device deteriorates due to a bonding failure which occurs at the time of bonding the bonding wire to the electrode pad.

SUMMARY OF THE INVENTION

According to an aspect, there is provided a semiconductor device including a circuit board including an insulating layer having a front surface and a rear surface opposite to the front surface, and an electrode pad disposed on the front surface; a housing having an installation area within which the circuit board is disposed; and a bonding material embedded in a recess disposed in a first area or a second area, wherein the first area is located at the rear surface of the insulating layer and is an area directly below an area of the circuit board in which the electrode pad is disposed, and the second area is located within the installation area and at an area corresponding to the first area in a plan view of the semiconductor device.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

A semiconductor device according to a first embodiment will now be described by the use of FIGS. 1A and 1B and FIGS. 2A and 2B. FIGS. 1A and 1B and FIGS. 2A and 2B are views for describing a semiconductor device according to a first embodiment. FIGS. 1A and 1B and FIGS. 2A and 2B are enlarged sectional views of portions near electrode pads of semiconductor devices. In particular, FIG. 1B and FIG. 2B illustrate the ultrasonic bonding of bonding wires to the electrode pads of the semiconductor devices.

Figure 1A:
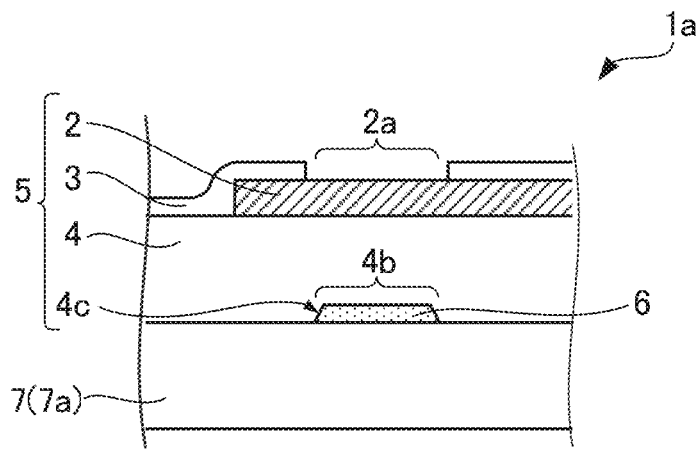
FIGS. 1A and 1B are views for describing a semiconductor device according to a first embodiment (part 1)
Figure 1B:
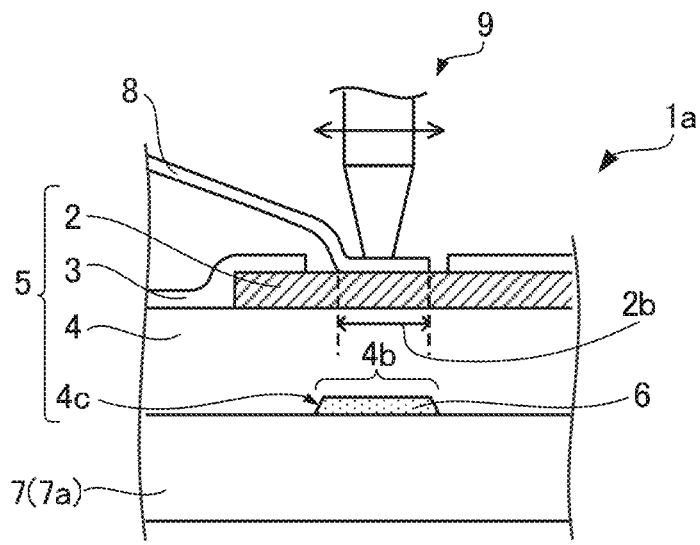
Figure 2A:
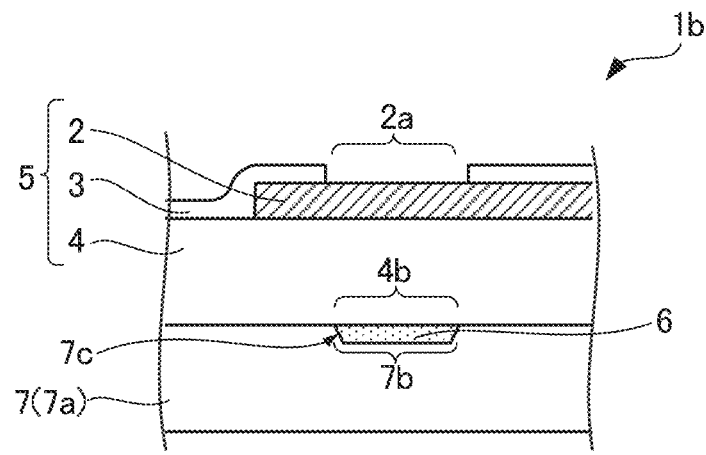
FIGS. 2A and 2B are views for describing a semiconductor device according to the first embodiment (part 2)
Figure 2B:
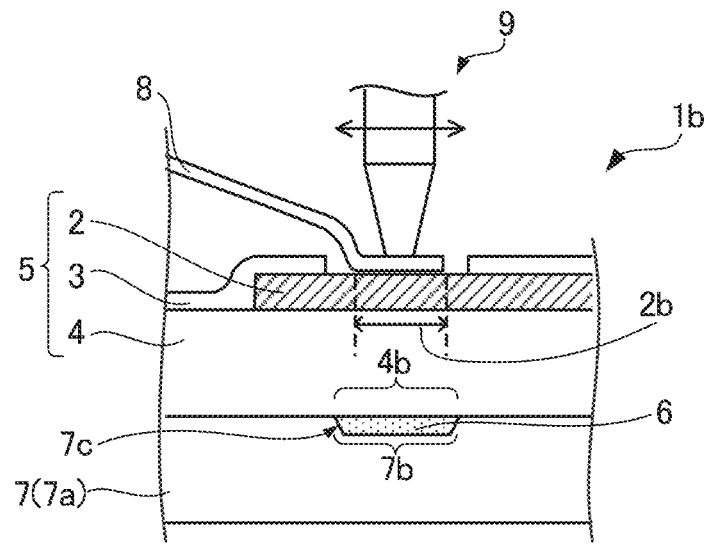

Each of semiconductor devices 1a and 1b illustrated in FIGS. 1A and 2A, respectively, includes a circuit board 5 and a housing (enclosure) 7. The circuit board 5 has an electrode pad 2a and an insulating layer 4 over whose front surface the electrode pad 2a is formed. The circuit board 5 is, for example, a printed-circuit board. A resist 3 is formed over a conductive pattern 2 formed over the front surface of the insulating layer 4. The electrode pad 2a is an area of the conductive pattern 2 corresponding to an opening portion of the resist 3. The housing 7 has an installation area 7a over which the circuit board 5 is disposed, and houses the circuit board 5. In FIGS. 1A and 1B and FIGS. 2A and 2B, the installation area 7a is illustrated as part of the housing 7 and these symbols are indicated side by side.

Furthermore, with the semiconductor device 1a illustrated in FIG. 1A, a concave portion 4c is formed in a first area 4b of the back surface of the insulating layer 4 just under the electrode pad 2a and a bonding material 6 is buried in the concave portion 4c. In addition, with the semiconductor device 1b illustrated in FIG. 2A, a concave portion 7c is formed in a second area portion 7b of the installation area 7a opposite the first area 4b of the circuit board 5 to be disposed and the bonding material 6 is buried in the concave portion 7c. The concave portion 4c is formed in the first area 4b just under the electrode pad 2a so that it will correspond to a bonding area 2b. For example, it is desirable that the width of the concave portion 4c be greater than or equal to 0.8 times the width of the bonding area 2b and smaller than or equal to 1.2 times the width of the bonding area 2b. This is the same with the concave portion 7c.

The ultrasonic bonding of a bonding wire 8 to the electrode pad 2a of the above semiconductor device 1a or 1b will now be described. With the semiconductor device 1a or 1b, as illustrated in FIG. 1B or 2B, first the bonding wire 8 is disposed over the bonding area 2b of the electrode pad 2a. The bonding wire 8 is bonded by ultrasonic bonding by the use of a bonding tool 9. The bonding material 6 is buried in the concave portion 4c of the semiconductor device 1a or the concave portion 7c of the semiconductor device 1b. Therefore, at this time not a layer of air but the bonding material 6 is disposed just under the electrode pad 2a. The electrode pad 2a is reliably bonded to the housing 7 via the insulating layer 4 and the bonding material 6 just under the electrode pad 2a. This suppresses vibration of the electrode pad 2a which may be generated by ultrasonic vibration caused by the bonding tool 9. As a result, the bonding wire 8 is reliably bonded to the electrode pad 2a.

A case where the concave portion 4c or 7c is not formed in the insulating layer 4 of the semiconductor device 1a or the installation area 7a of the housing 7 of the semiconductor device 1b and where the bonding material 6 is not disposed just under the electrode pad 2a will now be described. If a layer of air is interposed between the circuit board 5 just under the electrode pad 2a and the installation area 7a of the housing 7, then the electrode pad 2a also vibrates due to ultrasonic vibration caused by the bonding tool 9. As a result, the bonding wire 8 is not reliably bonded to the electrode pad 2a and a bonding failure may occur at the time of bonding the bonding wire 8 to the electrode pad 2a. With the semiconductor device 1a illustrated in FIGS. 1A and 1B or the semiconductor device 1b illustrated in FIGS. 2A and 2B, however, the occurrence of a bonding failure is suppressed and deterioration in reliability is prevented.

Figure 3:
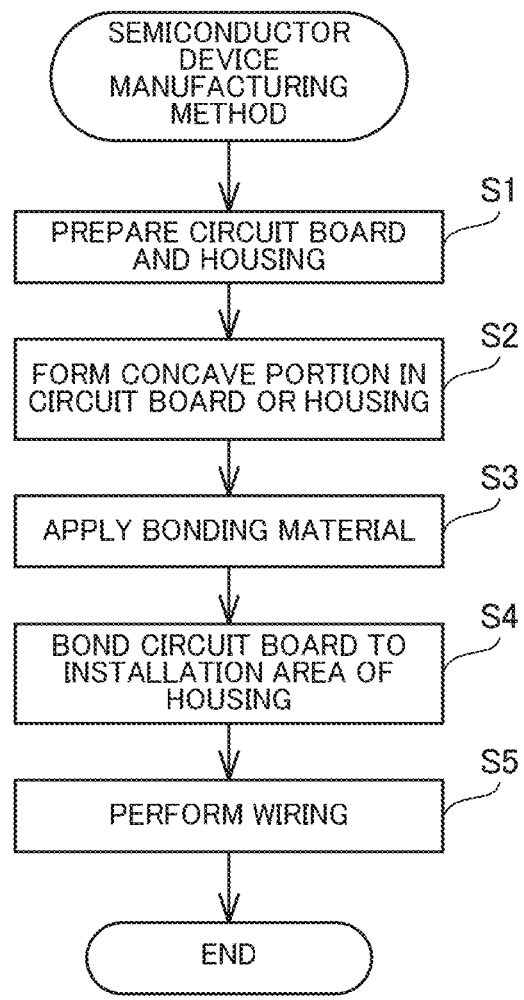
FIG. 3 is a flow illustrative of a method for manufacturing the semiconductor device according to the first embodiment.
Figure 4A:
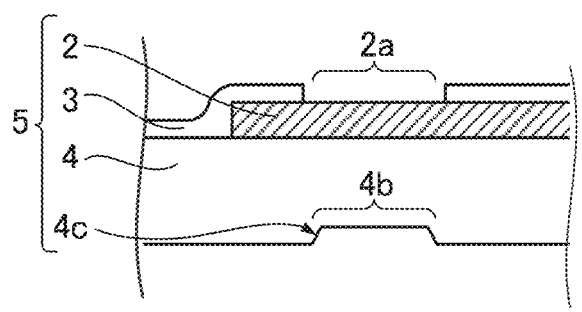
FIGS. 4A and 4B are views for describing the method for manufacturing the semiconductor device according to the first embodiment (part 1)
Figure 4B:
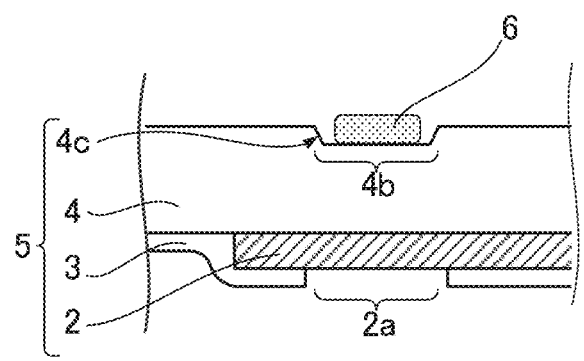
Figure 5A:
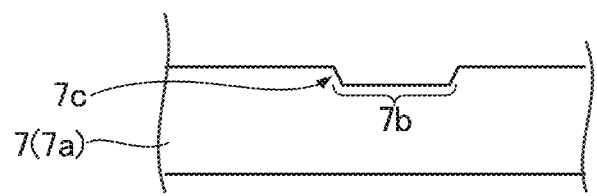
FIGS. 5A and 5B are views for describing the method for manufacturing the semiconductor device according to the first embodiment (part 2)
Figure 5B:
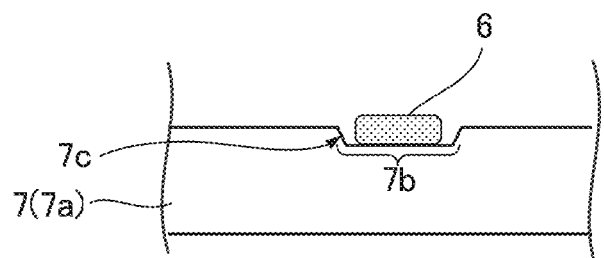

A method for manufacturing the semiconductor devices 1a and 1b will now be described by the use of FIGS. 3, 4A and 4B, and 5A and 5B, FIGS. 1A and 1B, and FIGS. 2A and 2B. FIG. 3 is a flow illustrative of a method for manufacturing the semiconductor device according to the first embodiment. FIGS. 4A and 4B and FIGS. 5A and 5B are views for describing the method for manufacturing the semiconductor device according to the first embodiment. FIGS. 4A and 4B illustrate a method for manufacturing the semiconductor device 1a illustrated in FIGS. 1A and 1B. FIGS. 5A and 5B illustrate a method for manufacturing the semiconductor device 1b illustrated in FIGS. 2A and 2B.

(Step S1) The circuit board 5 and the housing 7 are prepared.

(Step S2) The concave portion 4c or the concave portion 7c is formed in the circuit board 5 or the housing 7. As illustrated in FIG. 4A, for example, the concave portion 4c is formed in the first area 4b of the back surface of the insulating layer 4 of the circuit board 5 just under the electrode pad 2a. Furthermore, as illustrated in FIG. 5A, the concave portion 7c is formed in the second area portion 7b of the installation area 7a of the housing 7 over which the circuit board 5 is to be disposed. The second area portion 7b is just under the electrode pad 2a. The concave portion 4c or the concave portion 7c is formed by etching, machining, or the like. The concave portion 4c may be formed by laminating resist resin or the like over the back surface of the insulating layer 4 of the circuit board 5 except the concave portion 4c. Furthermore, the circuit board 5 which is molded so that the concave portion 4c will be formed in advance may be prepared in step S1. The housing 7 which is molded so that the concave portion 7c will be formed in advance may be prepared in step S1.

(Step S3) The bonding material 6 is applied to the concave portion 4c formed in the circuit board 5 or the concave portion 7c formed in the housing 7. As illustrated in FIG. 4B, for example, the bonding material 6 is applied to the concave portion 4c with the concave portion 4c in the circuit board 5 upward. Furthermore, as illustrated in FIG. 5B, the bonding material 6 is applied to the concave portion 7c in the installation area 7a of the housing 7. At this time, it is easy to visually recognize a position at which the bonding material 6 is applied by the concave portion 4c or 7c. That is to say, the bonding material 6 is not applied at a wrong position and is reliably applied to the concave portion 4c or 7c. The bonding material 6 is applied to the concave portion 4c or 7c by, for example, stencil printing or a syringe-type dispenser. At this time the bonding material 6 is applied with the volume of the concave portion 4c or 7c as a yardstick. By doing so, a proper amount of the bonding material 6 is applied. As described later, this prevents a layer of air from being interposed at a bonding portion just under the electrode pad 2a. Furthermore, this prevents the bonding material 6 from protruding from between the circuit board 5 and the installation area 7a of the housing 7.

In addition, in the case of FIG. 4B, the bonding material 6 may be applied to the installation area 7a of the housing 7 corresponding to the concave portion 4c when the circuit board 5 is disposed over the installation area 7a of the housing 7. Similarly, in the case of FIG. 5B, the bonding material 6 may be applied to the insulating layer 4 of the circuit board 5 corresponding to the concave portion 7c when the circuit board 5 is disposed over the installation area 7a of the housing 7.

(Step S4) The circuit board 5 is disposed over the installation area 7a of the housing 7 and is pressed against the installation area 7a. Heating is performed at a determined temperature for a determined time. By doing so, the bonding material 6 is solidified. As a result, as illustrated in FIG. 1A or 2A, for example, the circuit board 5 is bonded to the installation area 7a of the housing 7 and the semiconductor device 1a or 1b is formed. At this time the bonding material 6 is buried in the concave portion 4c or 7c. Therefore, there is no vacant space in the concave portion 4c or 7c and the bonding material 6 does not protrude from between the circuit board 5 and the installation area 7a of the housing 7. The circuit board 5 is reliably bonded to the installation area 7a of the housing 7.

(Step S5) As illustrated in FIG. 1B or 2B, the bonding wire 8 is bonded to the electrode pad 2a or the like of the semiconductor device 1a or 1b by ultrasonic bonding by the use of the bonding tool 9. By doing so, electrical wiring is performed.

After the above steps, needed manufacturing steps are performed. For example, the circuit board 5, the bonding wire 8, and the like in the housing 7 are sealed with a sealing member. By doing so, the semiconductor device 1a or 1b is manufactured.

The above semiconductor device 1a or 1b includes the circuit board 5 having the electrode pad 2a and the insulating layer 4 over whose front surface the electrode pad 2a is formed and the housing 7 having the installation area 7a over which the circuit board 5 is disposed. The housing 7 houses the circuit board 5. Furthermore, the concave portion 4c or 7c in which the bonding material 6 is buried is formed in the first area 4b of the back surface of the insulating layer 4 right under the electrode pad 2a or in the second area portion 7b right under the electrode pad 2a of the installation area 7a opposite the first area 4b of the circuit board 5 to be disposed. Accordingly, the electrode pad 2a is reliably bonded to the housing 7 via the insulating layer 4 and the bonding material 6 right under the electrode pad 2a. With the semiconductor device 1a or 1b, the bonding wire 8 is disposed over the bonding area 2b of the electrode pad 2a and is bonded by ultrasonic bonding by the use of the bonding tool 9. This suppresses vibration of the electrode pad 2a which may be generated by ultrasonic vibration caused by the bonding tool 9. As a result, the bonding wire 8 is reliably bonded to the electrode pad 2a. Furthermore, when the circuit board 5 is bonded to the installation area 7a of the housing 7, the bonding material 6 is buried in the concave portion 4c or 7c. Accordingly, the bonding material 6 does not protrude from between the circuit board 5 and the installation area 7a of the housing 7 and does not spread to the side of the electrode pad 2a. The electrode pad 2a of the circuit board 5 and the installation area 7a of the housing 7 are reliably bonded together. As a result, the bonding wire 8 is reliably bonded to the electrode pad 2a. Protrusion of the bonding material 6 is suppressed and the occurrence of an electrical failure is prevented. This suppresses deterioration in the reliability of the semiconductor device 1a or 1b.

In addition, when the bonding material 6 is applied to the circuit board 5 or the installation area 7a of the housing 7, the concave portion 4c formed in the circuit board 5 or the concave portion 7c formed in the housing 7 functions as a mark. As a result, an application position is easily recognized. This reduces the manufacturing costs of the semiconductor device 1a or 1b.

Second Embodiment

Figure 6:
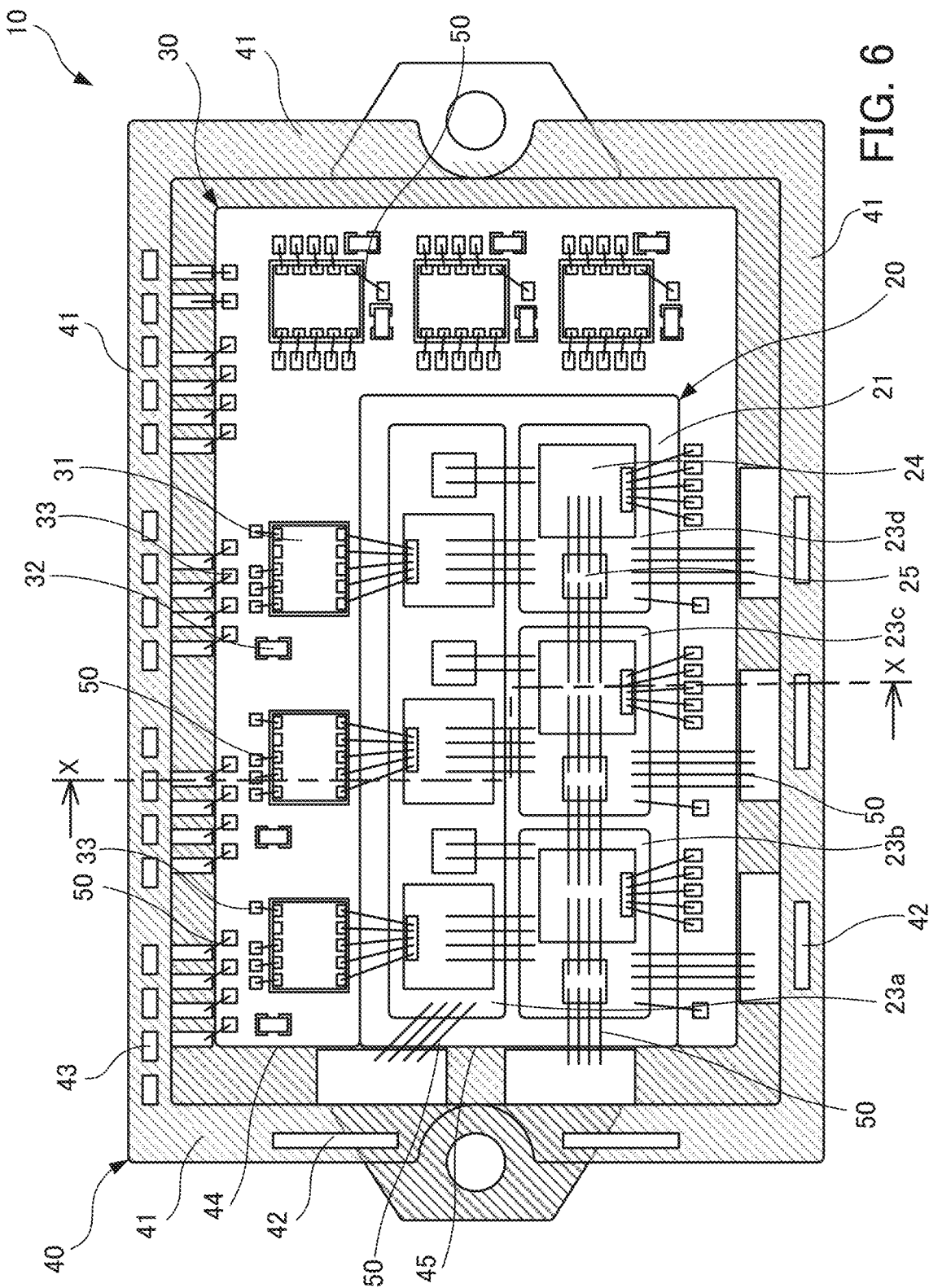
FIG. 6 is a plan view of a semiconductor device according to a second embodiment.
Figure 7:
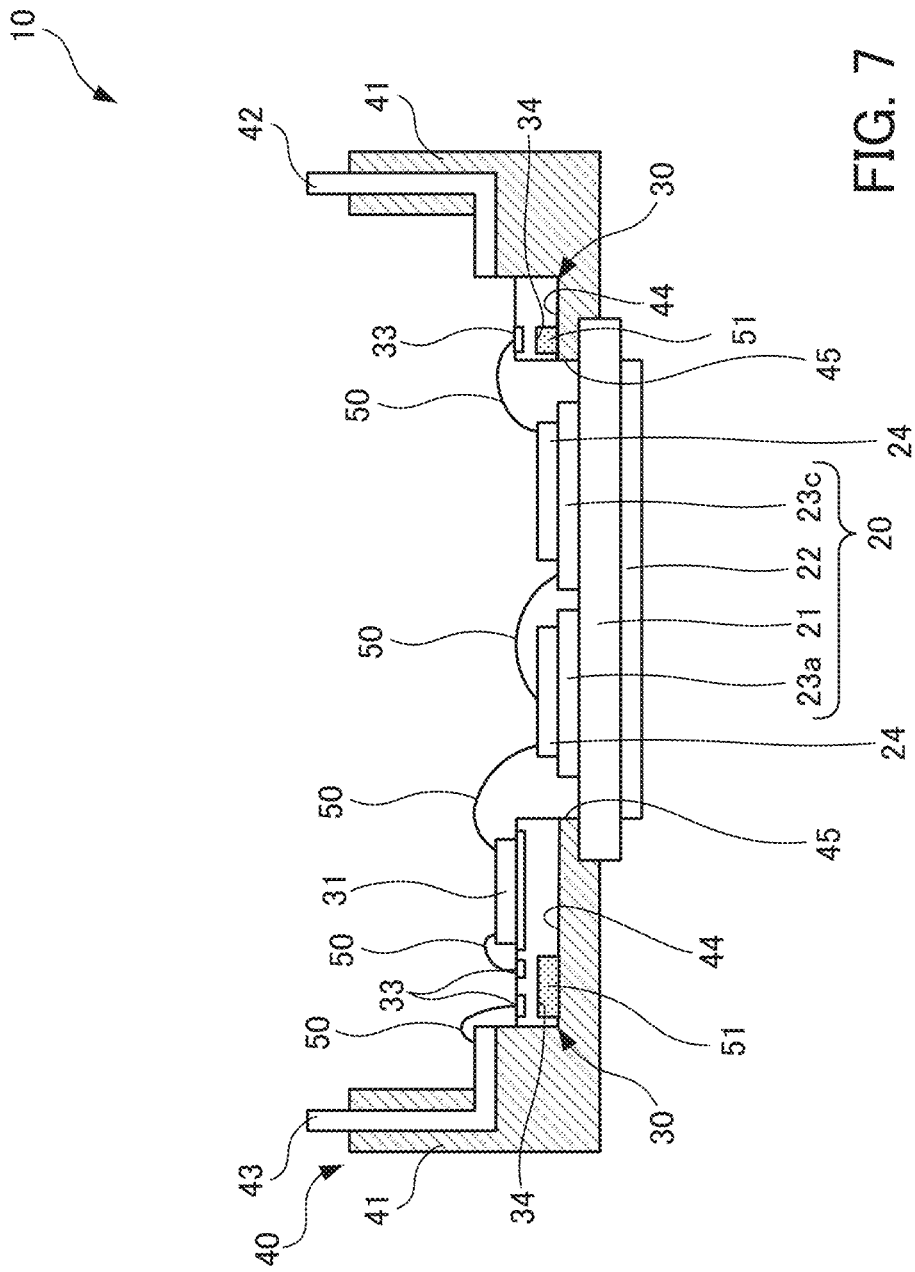
FIG. 7 is a sectional view of the semiconductor device according to the second embodiment.
Figure 8:
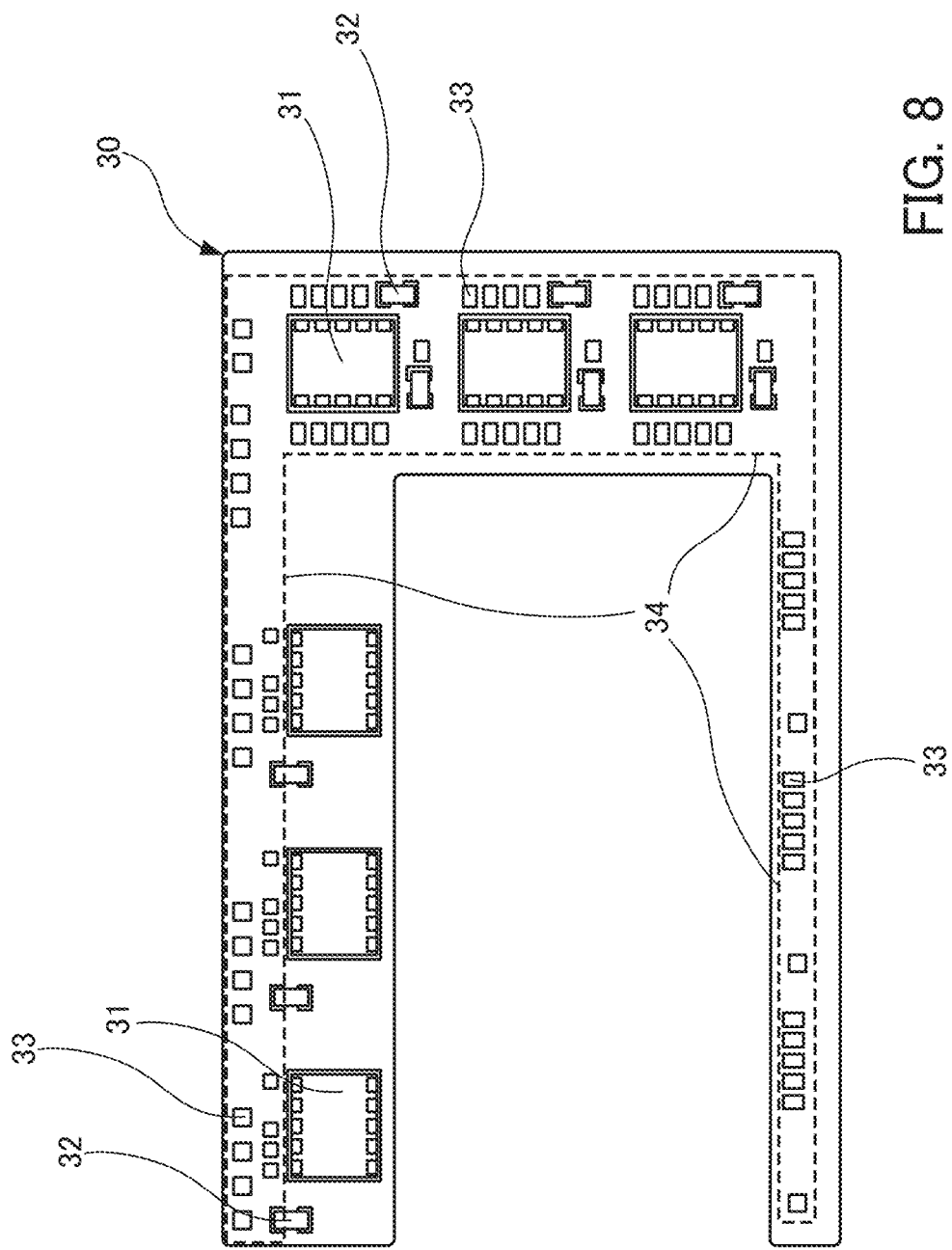
FIG. 8 is a plan view of a printed-circuit board included in the semiconductor device according to the second embodiment.

In a second embodiment, the semiconductor device 1a according to the first embodiment in which the concave portion 4c is formed in the back surface of the circuit board 5 will be described concretely by the use of FIGS. 6 through 8. FIG. 6 is a plan view of a semiconductor device according to a second embodiment. FIG. 7 is a sectional view of the semiconductor device according to the second embodiment. FIG. 8 is a plan view of a printed-circuit board included in the semiconductor device according to the second embodiment. In FIGS. 6 through 8, at least one of a plurality of components is marked with the same numeral. FIG. 7 is a sectional view taken along the dot-dash line X-X of FIG. 6. In FIG. 8, a position on the back surface of a printed-circuit board 30 in which a groove portion 34 is formed is indicated by a dashed line. In FIGS. 6 and 8, a front surface corresponds to a displayed side. In FIG. 7, a front surface corresponds to an upper side. In FIGS. 6 and 8, a back surface corresponds to a side not displayed. In FIG. 7, a back surface corresponds to a lower side.

A semiconductor device 10 includes a ceramic circuit board 20 over whose front surface switching elements 24 and diode elements 25 are disposed, the printed-circuit board 30, and a case 40 which houses the ceramic circuit board 20 and the printed-circuit board 30.

The ceramic circuit board 20 has an insulating plate 21 and a metal plate 22 formed over the back surface of the insulating plate 21. Furthermore, the ceramic circuit board 20 has circuit patterns 23a through 23d formed over the front surface of the insulating plate 21.

The insulating plate 21 is made of a high thermal conductivity ceramic such as aluminum oxide, aluminum nitride, or silicon nitride. The metal plate 22 is made of a high thermal conductivity metal such as aluminum, iron, silver, copper, or an alloy containing at least one of them.

The circuit patterns 23a through 23d is made of a metal having good conductivity, such as copper or a copper alloy. Furthermore, the switching elements 24 and the diode elements 25 are disposed over the circuit patterns 23a through 23d with solder (not illustrated) therebetween. The number or the shape of the circuit patterns 23a through 23d is an example. Another number or shape may be adopted. For example, the thickness of the circuit patterns 23a through 23d is greater than or equal to 0.1 mm and smaller than or equal to 1 mm.

A direct copper bonding (DCB) board, an active metal brazed (AMB) board, or the like is used as the ceramic circuit board 20 having the above structure. The ceramic circuit board 20 conducts heat generated by the switching elements 24 and the diode elements 25 to the outside (lower side in FIG. 7) via the circuit patterns 23a through 23d, the insulating plate 21, and the metal plate 22.

The switching elements 24 and the diode elements 25 are made of silicon or silicon carbide. Each switching element 24 includes an IGBT, a power MOSFET, or the like. For example, each switching element 24 has an input electrode (drain or collector electrode) as a main electrode on the back surface and has a control electrode (gate electrode) and an output electrode (source or emitter electrode) as a main electrode on the front surface. Furthermore, each diode element 25 includes an SBD, an FWD, or the like at need. Each diode element 25 has an output electrode (cathode electrode) as a main electrode on the back surface and has an input electrode (anode electrode) as a main electrode on the front surface. In addition, semiconductor elements including a reverse-conducting (RC)-IGBT may be used in place of the switching elements 24 and the diode elements 25.

Furthermore, a radiation plate or a cooler (not illustrated) may be fixed via a screw, solder, silver solder, or the like on the metal plate 22 of the above ceramic circuit board 20 exposed from the back surface of the case 40 in order to improve the heat radiation property. In this case, the radiation plate or the cooler is made of a high thermal conductivity metal such as aluminum, iron, silver, copper, or an alloy containing at least one of them. In addition, a fin, a heat sink made up of a plurality of fins, a water-cooling cooler, or the like may be used as the cooler.

The printed-circuit board 30 has the shape of the letter "U" in planar view and is disposed in the case 40 so that it will enclose the three sides of the ceramic circuit board 20. Furthermore, the printed-circuit board 30 has an insulating substrate and a single-layer or multilayer conductive pattern formed on the insulating substrate (not illustrated). It is desirable that the thickness of the printed-circuit board 30 be greater than or equal to 0.1 mm and smaller than or equal to 2.5 mm. It is more desirable that the thickness of the printed-circuit board 30 be greater than or equal to 0.6 mm and smaller than or equal to 1.0 mm. For example, a glass nonwoven fabric, a glass woven fabric impregnated with epoxy resin, or a glass fiber impregnated with polyimide resin is used as the substrate. In addition, the substrate may be glass epoxy resin having heat resistance. The conductive pattern is made of a metal having good conductivity, such as copper or a copper alloy. A resist layer (not illustrated) is formed over the conductive pattern formed over the front surface of the substrate and an area of the conductive pattern exposed by forming an opening in a determined area of the resist layer is used as an electrode pad 33. Furthermore, control integrated circuits (IC) 31 and electronic parts 32 are properly disposed over areas of the conductive pattern exposed by forming openings in other areas of the resist layer. For example, a control IC 31 inputs an input signal to a control electrode of a switching element 24 in response to an external signal. An electronic part 32 is a resistor, a thermistor, a capacitor, a surge absorber, or the like. In addition, as illustrated in FIG. 8, a groove portion 34 including areas corresponding to electrode pads 33 is formed in the back surface of the above printed-circuit board 30. The depth of the groove portion 34 is smaller than or equal to fifty percent of the thickness of the printed-circuit board 30. It is desirable that the depth of the groove portion 34 be greater than or equal to 5 μm and smaller than or equal to 500 μm. It is more desirable that the depth of the groove portion 34 be greater than or equal to 10 μm and smaller than or equal to 100 μm. A concave portion may be formed in an area of the back surface of the printed-circuit board 30 corresponding to each electrode pad 33. The groove portion 34 includes such a concave portion. In addition, the shape of the groove portion 34 is an example. Another shape may be adopted so long as the groove portion 34 includes a concave portion corresponding to each electrode pad 33. In the case of the second embodiment, the groove portion 34 is formed so that it will include such a concave portion. It is easier to work the printed-circuit board 30 than to form each concave portion in the back surface of the printed-circuit board 30.

Furthermore, an adhesive 51 is buried in an area enclosed by the groove portion 34 of the printed-circuit board 30 and an installation area 44 of the case 40. It is desirable that the adhesive 51 be a thermoplastic resin which softens and solidifies according to temperature or a thermosetting resin which solidifies as a result of a chemical reaction by heating. Vinyl acetate resin, polyvinyl alcohol, polyamide resin, or the like is used as a thermoplastic resin. Epoxy resin, silicone resin, polyimide resin, urethane resin (polyurethane), ester resin (polyester), or the like is used as a thermosetting resin.

The case 40 is surrounded on all sides by a side wall portion 41 and has the shape of a box. The installation area 44 over which the printed-circuit board 30 is disposed and an opening portion 45 whose three sides are surrounded by the installation area 44 and in which the ceramic circuit board 20 is disposed are inside the case 40. A plurality of control terminals 43 and a plurality of main terminals 42 are integrally molded with the side wall portion 41 along its sides. The case 40 is formed by mold molding by the use of, for example, a thermoplastic resin so as to contain the plurality of control terminals 43 and the plurality of main terminals 42. Polyphenylene sulfide, polybutylene terephthalate resin, polybutylene succinate resin, polyamide resin, acrylonitrile butadiene styrene resin, or the like is used as such a thermoplastic resin.

The printed-circuit board 30 is disposed over the installation area 44 of the case 40 and the ceramic circuit board 20 is disposed in the opening portion 45 of the case 40. Furthermore, the electrode pads 33 of the printed-circuit board 30 are electrically connected to the control terminals 43, electrodes of the control ICs 31, the control electrodes of the switching elements 24, and the circuit patterns 23*b* through 23*d* by bonding wires 50. In addition, electrodes of the control ICs 31, the control electrodes of the switching elements 24, the circuit pattern 23*a*, the main terminals 42, and the like are electrically connected by bonding wires 50. The bonding wires 50 are made of a metal having good conductivity, such as aluminum, copper, an aluminum alloy, or a copper alloy. In addition, it is desirable that the diameter of the bonding wires 50 be greater than or equal to 100 μm and smaller than or equal to 1 mm. The bonding wires have been described. However, wiring members are not limited to the bonding wires 50. Wiring members which is capable of being bonded to the electrode pads 33 by ultrasonic bonding may be used. Conductive ribbons, lead frames, or the like may be used as such wiring members.

Furthermore, the ceramic circuit board 20, the switching elements 24, the diode elements 25, the printed-circuit board 30, the bonding wires 50, and the like housed in this way in the case 40 are sealed with a sealing member (not illustrated). A thermosetting resin, such as maleimide-modified epoxy resin, maleimide-modified phenolic resin, or maleimide resin, is used as such a sealing member. In addition, silicone gel may be used as such a sealing member.

In order to manufacture the above semiconductor device 10, first the adhesive 51 is applied by stencil printing to the groove portion 34 formed in the back surface of the printed-circuit board 30 or a portion of the installation area 44 of the case 40 corresponding to the groove portion 34. The printed-circuit board 30 is disposed over the installation area 44 of the case 40 with the adhesive 51 therebetween and the ceramic circuit board 20 is disposed in the opening portion 45 of the case 40 with an adhesive (not illustrated) therebetween.

At the same time that the printed-circuit board and the ceramic circuit board 20 are being pressed downward, heating is performed, for example, at a temperature higher than or equal to 150° C. and lower than or equal to 170° C. for a time longer than or equal to 3 minutes and shorter than or equal to 5 minutes. By doing so, the adhesive 51 is hardened.

Furthermore, the electrode pads 33 of the printed-circuit board 30 are electrically connected by the bonding wires 50 to the control terminals 43, the electrodes of the control ICs 31, the control electrodes of the switching elements 24, and the circuit patterns 23*b* through 23*d* by ultrasonic bonding by the use of a bonding tool (not illustrated) (FIG. 6).

The semiconductor device 10 manufactured in this way includes the printed-circuit board 30 over whose front surface the electrode pads 33 are formed and the case 40 having the installation area 44 over which the printed-circuit board 30 is disposed and housing the printed-circuit board 30. Furthermore, the groove portion 34 in which the adhesive 51 is buried is formed in the back surface of the printed-circuit board 30 right under the electrode pads 33. Accordingly, the electrode pads 33 are reliably bonded to the case 40 via the adhesive 51 right under the electrode pads 33. With the semiconductor device 10, the bonding wires 50 are disposed over the electrode pads 33 and are bonded by ultrasonic bonding by the use of the bonding tool (not illustrated). This suppresses vibration of the electrode pads 33 which may be generated by ultrasonic vibration caused by the bonding tool. As a result, the bonding wires 50 are reliably bonded to the electrode pads 33. In addition, when the printed-circuit board 30 is bonded to the installation area 44 of the case 40, the adhesive 51 is buried in the groove portion 34. Accordingly, the adhesive 51 does not protrude from between the printed-circuit board 30 and the installation area 44 of the case 40 and does not spread to the side of the electrode pads 33. The printed-circuit board 30 and the installation area 44 of the case 40 are reliably bonded together. As a result, the bonding wires 50 are reliably bonded to the electrode pads 33. Protrusion of the adhesive 51 is suppressed and the occurrence of an electrical failure is prevented. This suppresses deterioration in the reliability of the semiconductor device 10.

In addition, when the adhesive 51 is applied to the printed-circuit board 30, the groove portion 34 formed in the printed-circuit board 30 functions as a mark. As a result, an application position is easily recognized. This reduces the manufacturing costs of the semiconductor device 10.

Figure 9:
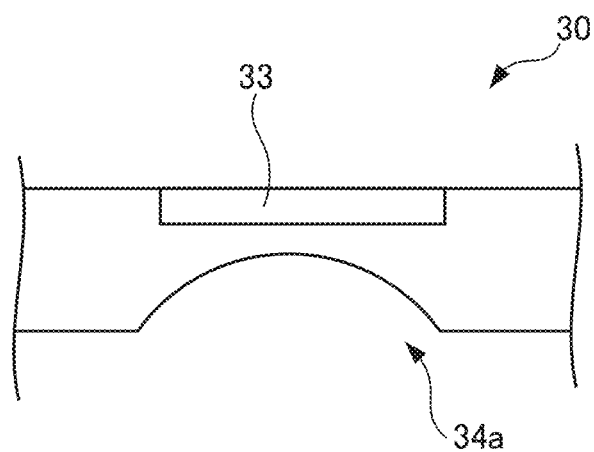
FIG. 9 is a sectional view of another groove portion formed in the printed-circuit board included in the semiconductor device according to the second embodiment.

A case where a section of the groove portion 34 in the second embodiment is approximately square in shape has been described. A case where a section of the groove portion 34 has another shape will now be described by the use of FIG. 9. FIG. 9 is a sectional view of another groove portion formed in the printed-circuit board included in the semiconductor device according to the second embodiment. FIG. 9 is an enlarged sectional view of a portion near an electrode pad 33 of the printed-circuit board 30. Furthermore, in FIG. 9, a front surface corresponds to an upper side and a back surface corresponds to a lower side.

A section of a groove portion 34a illustrated in FIG. 9 and formed in the back surface of the printed-circuit board 30 corresponding to an electrode pad 33 is not approximately square but approximately semicircular in shape. For example, the adhesive 51 is applied to the groove portion 34a of the printed-circuit board 30 whose section has the above shape and the printed-circuit board 30 is disposed over the installation area 44 of the case 40. At this time the volume of residual air is reduced at a corner portion in the groove portion 34a because the corner portion has a curved surface. Accordingly, a bonding wire 50 is bonded more reliably to the electrode pad 33 by ultrasonic bonding in a case where the groove portion 34a whose section is approximately semicircular in shape is formed in the printed-circuit board 30 than in a case where the groove portion 34 (FIG. 7) is formed in the printed-circuit board 30. Furthermore, a section of the groove portion 34 may have the shape of the letter "U". In this case, a corner portion in the groove portion 34 also has a curved surface. In this case, the volume of residual air is also reduced at the corner portion. As a result, a bonding wire 50 is bonded more reliably to the electrode pad 33.

Third Embodiment

In a third embodiment a case where a groove portion is formed not in the back surface of the printed-circuit board 30 in the semiconductor device 10 according to the second embodiment but in an installation area 44 of a case 40 will be described as an example by the use of FIGS. 10 and 11. Components in a third embodiment which are the same as those of the semiconductor device 10 according to the second embodiment are marked with the same numerals and detailed descriptions of them will be omitted.

Figure 10:
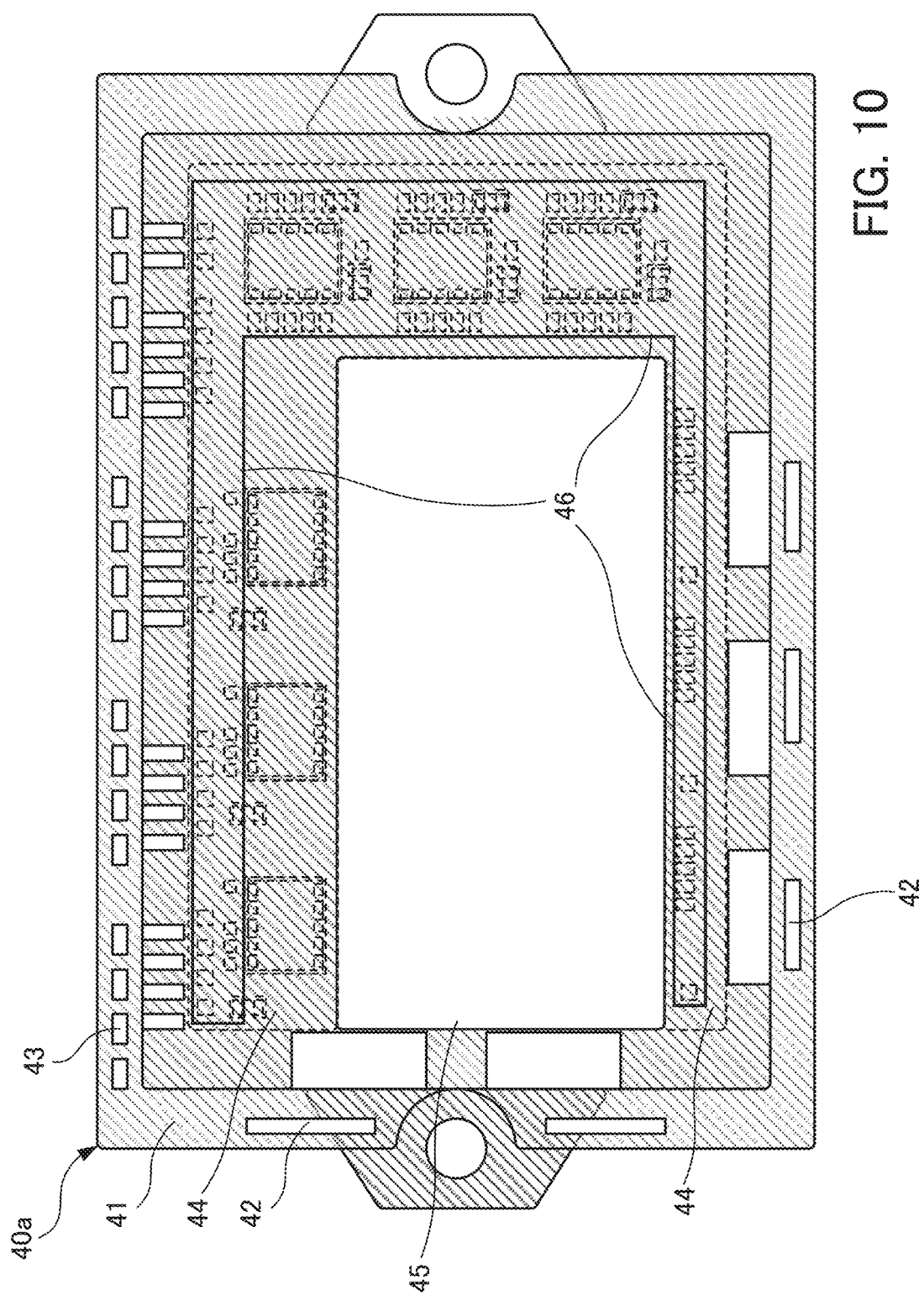
FIG. 10 is a plan view of a case included in a semiconductor device according to a third embodiment.

FIG. 10 is a plan view of a case included in a semiconductor device according to a third embodiment. FIG. 11 is a sectional view of the semiconductor device according to the third embodiment. In FIG. 10, the positions of electrode pads, control ICs, electronic parts, and the like at the time of disposing a printed-circuit board 30a in a case 40a are indicated by dashed lines. FIG. 11 is a sectional view of a semiconductor device 10a taken along a line corresponding to the dot-dash line X-X of FIG. 6. In FIG. 10, a front surface corresponds to a displayed side. In FIG. 11, a front surface corresponds to an upper side. In FIG. 10, a back surface corresponds to a side not displayed. In FIG. 11, a back surface corresponds to a lower side.

The semiconductor device 10a also includes a ceramic circuit board 20 over whose front surface switching elements 24 and diode elements 25 are disposed, the printed-circuit board 30a, and the case 40a which houses the ceramic circuit board 20 and the printed-circuit board 30a. As illustrated in FIG. 11, however, a groove portion 34 is not formed in the printed-circuit board 30a. The printed-circuit board 30a differs from the printed-circuit board 30 in this respect. As illustrated in FIG. 10, a groove portion 46 is formed in the front surface of an installation area 44 of the case 40a of the semiconductor device 10a so that it will include an area portion corresponding to each electrode pad 33 at the time of disposing the printed-circuit board 30a. It is desirable that the depth of the groove portion 46 be greater than or equal to 5 µm and smaller than or equal to 500 µm. It is more desirable that the depth of the groove portion 46 be greater than or equal to 10 µm and smaller than or equal to 100 µm. This is the same with the groove portion 34. A concave portion may be formed in an area portion of the installation area 44 of the case 40a corresponding to each electrode pad 33. The groove portion 46 includes such a concave portion. In addition, the shape of the groove portion 46 is an example. Another shape may be adopted so long as the groove portion 46 includes a concave portion corresponding to each electrode pad 33. In the case of the third embodiment, the groove portion 46 is formed so that it will include such a concave portion. It is easier to work the case 40a than to form each concave portion in the installation area 44 of the case 40a.

In order to manufacture the above semiconductor device 10a, first an adhesive 51 is applied by a dispenser to the groove portion 46 formed in the installation area 44 of the case 40a or an area of the back surface of the printed-circuit board 30a corresponding to the groove portion 46. The printed-circuit board 30a is disposed over the installation area 44 of the case 40a with the adhesive 51 therebetween and the ceramic circuit board 20 is disposed in an opening portion 45 of the case 40a with an adhesive (not illustrated) therebetween.

At the same time that the printed-circuit board 30a and the ceramic circuit board 20 are being pressed downward, heating is performed, for example, at a temperature higher than or equal to 150° C. and lower than or equal to 170° C. for a time longer than or equal to 3 minutes and shorter than or equal to 5 minutes. By doing so, the adhesive 51 is hardened.

Figure 11:
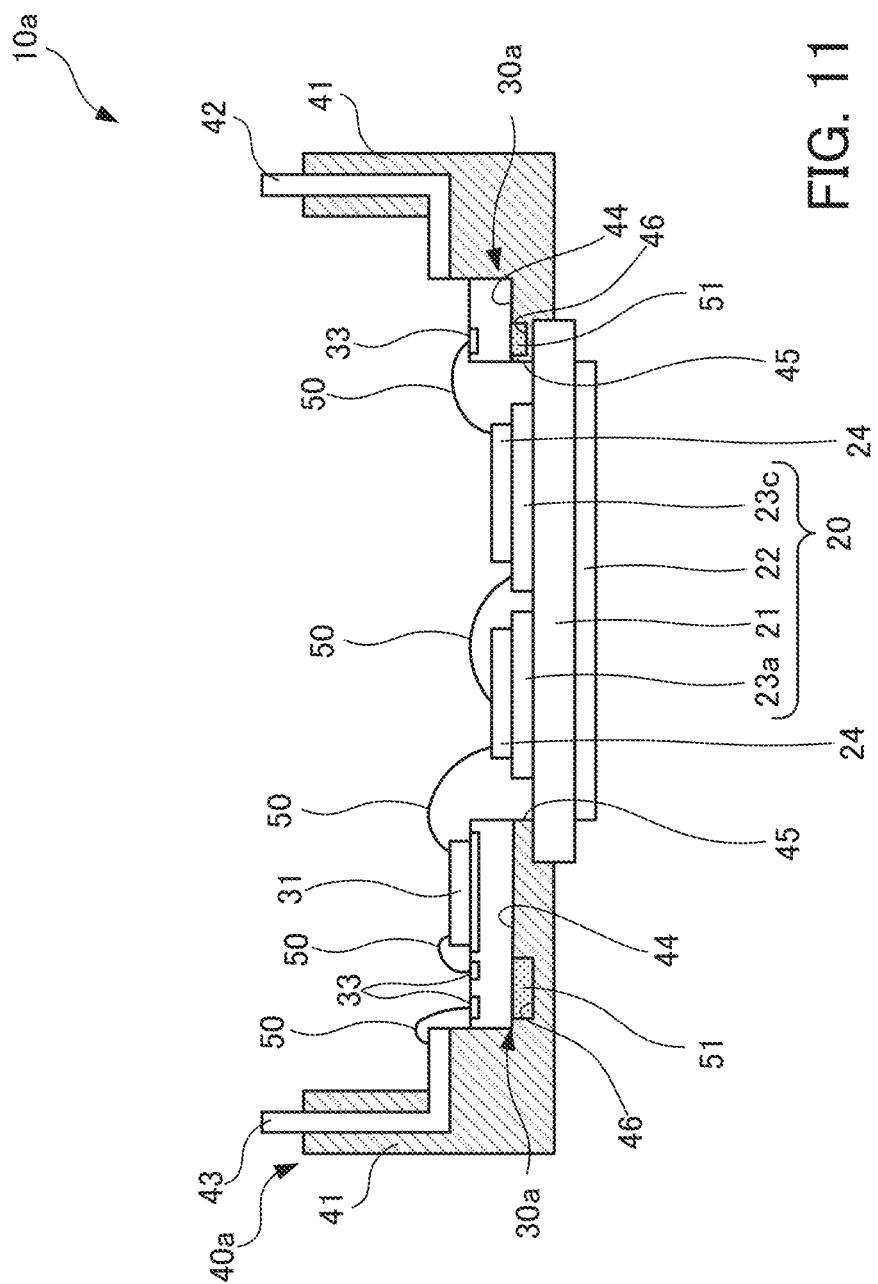
FIG. 11 is a sectional view of the semiconductor device according to the third embodiment.

Furthermore, the electrode pads 33 of the printed-circuit board 30a are electrically connected by bonding wires 50 to control terminals 43, electrodes of the control ICs 31, control electrodes of the switching elements 24, and circuit patterns 23b through 23d by ultrasonic bonding by the use of a bonding tool (not illustrated) (FIG. 11).

The semiconductor device 10a manufactured in this way includes the printed-circuit board 30a over whose front surface the electrode pads 33 are formed and the case 40a having the installation area 44 over which the printed-circuit board 30a is disposed and housing the printed-circuit board 30a. Furthermore, the groove portion 46 in which the adhesive 51 is buried is formed in the front surface of the installation area 44 of the case 40a right under the electrode pads 33. Accordingly, the electrode pads 33 are reliably bonded to the case 40a via the adhesive 51 right under the electrode pads 33. With the semiconductor device 10a, the bonding wires 50 are disposed over the electrode pads 33 and are bonded by ultrasonic bonding by the use of the bonding tool (not illustrated). This suppresses vibration of the electrode pads 33 which may be generated by ultrasonic vibration caused by the bonding tool. As a result, the bonding wires 50 are reliably bonded to the electrode pads 33. In addition, when the printed-circuit board 30a is bonded to the installation area 44 of the case 40a, the adhesive 51 is buried in the groove portion 46. Accordingly, the adhesive 51 does not protrude from between the printed-circuit board 30a and the installation area 44 of the case 40a and does not spread to the side of the electrode pads 33. The printed-circuit board 30a and the installation area 44 of the case 40a are reliably bonded together. As a result, the bonding wires 50 are reliably bonded to the electrode pads 33. Protrusion of the adhesive 51 is suppressed and the occurrence of an electrical failure is prevented. This suppresses deterioration in the reliability of the semiconductor device 10a.

In addition, when the adhesive 51 is applied to the installation area 44 of the case 40a, the groove portion formed in the installation area 44 of the case 40a functions as a mark. As a result, an application position is easily recognized. This reduces the manufacturing costs of the semiconductor device 10a.

A section of the groove portion 46 in the third embodiment may be approximately semicircular in shape. This is the same with the groove portion 34a in the second embodiment. As a result, the volume of residual air is reduced at a corner portion in the groove portion 46 because the corner portion has a curved surface. The above groove portion 46 is formed in the case 40a. Accordingly, when the bonding wires 50 are bonded to the electrode pads 33 by ultrasonic bonding, deterioration in the property of conducting ultrasonic vibration is suppressed. As a result, the bonding wires 50 are bonded more reliably to the electrode pads 33.

According to the disclosed technique, a bonding wire is reliably bonded to an electrode pad and deterioration in the reliability of a semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a circuit board including an insulating layer having a front surface and a rear surface opposite to the front surface, and an electrode pad disposed on said front surface;
a housing having a front surface that includes an installation area within which the circuit board is disposed; and
a bonding material embedded in a recess formed at the rear surface of the insulating layer in an area directly below an area of the circuit board in which the electrode pad is disposed in a plan view of the semiconductor device, the rear surface of the insulating layer being recessed toward the electrode pad to form the recess, wherein
the electrode pad has a bonding area to which a bonding wire is bonded, and a width of the recess is in a range of 0.8 times to 1.2 times a width of the bonding area.

2. The semiconductor device according to claim 1, wherein the insulating layer has a groove portion which includes the recess.

3. The semiconductor device according to claim 1, wherein the recess has a semicircular shape in a sectional view of the semiconductor device.

4. The semiconductor device according to claim 1, wherein the recess is entirely filled with the bonding material.

5. The semiconductor device according to claim 1, wherein a bottom of the bonding material is flush with the rear surface of the insulating layer.

6. The semiconductor device according to claim 1, wherein the bonding material in the recess is in direct contact with the front surface of the housing.

7. The semiconductor device according to claim 1, further comprising a control terminal or a main terminal electrically connecting the circuit board and an external device, the bonding wire being directly connected to both the electrode pad and the control terminal or main terminal.

8. A semiconductor device, comprising:
a circuit board including an insulating layer having a front surface and a rear surface opposite to the front surface, and an electrode pad disposed on said front surface;
a housing having a front surface that includes an installation area within which the circuit board is disposed; and
a bonding material embedded in a recess formed at the front surface of the housing in an area directly below an area of the circuit board in which the electrode pad is disposed in a plan view of the semiconductor device, the rear surface of the insulating layer being in direct contact with the bonding material in the recess, wherein
the electrode pad has a bonding area to which a bonding wire is bonded, and
a width of the recess is in a range of 0.8 times to 1.2 times a width of the bonding area.

9. The semiconductor device according to claim 8, wherein the housing has a groove portion which includes the recess.

10. The semiconductor device according to claim 8, wherein the recess has a semicircular shape in a sectional view of the semiconductor device.

11. The semiconductor device according to claim 8, wherein the recess is entirely filled with the bonding material.

12. The semiconductor device according to claim 8, wherein a top of the bonding material is flush with the front surface of the housing.

13. The semiconductor device according to claim 8, wherein the rear surface of the insulating layer is entirely in direct contact with the front surface of the housing.

14. The semiconductor device according to claim 8, further comprising a control terminal or a main terminal electrically connecting the circuit board and an external device, the bonding wire being directly connected to both the electrode pad and the control terminal or main terminal.

15. A semiconductor device, comprising:
a circuit board including an insulating layer having a front surface and a rear surface opposite to the front surface, and an electrode pad disposed on said front surface;

a housing having a front surface that includes an installation area within which the circuit board is disposed; and a bonding material embedded in a recess disposed in a first area or a second area, and being in direct contact with both the rear surface of the circuit board and the front surface of the housing, wherein the first area is located at the rear surface of the insulating layer and is an area directly below an area of the circuit board in which the electrode pad is disposed, the second area is located within said installation area and at an area corresponding to the first area in a plan view of the semiconductor device, the rear surface of the circuit board is recessed toward the electrode pad to form the recess, or the front surface of the housing is recessed away from the electrode pad to form the recess, the electrode pad has a bonding area to which a bonding wire is bonded, and a width of the recess is in a range of 0.8 times to 1.2 times a width of the bonding area.

16. The semiconductor device according to claim 15, wherein the recess is entirely filled with the bonding material.

\* \* \* \* \*